United States Patent
Kim et al.

(10) Patent No.: US 8,023,311 B2
(45) Date of Patent: Sep. 20, 2011

(54) RESISTIVE MEMORY DEVICES INCLUDING SELECTED REFERENCE MEMORY CELLS OPERATING RESPONSIVE TO READ OPERATIONS

(75) Inventors: Hyun-Jo Kim, Gyeonggi-do (KR);
Kyung-Tae Nam, Gyeonggi-do (KR);
In-Gyu Baek, Seoul-si (KR); Se-Chung Oh, Gyeonggi-do (KR); Jang-Eun Lee, Gyeonggi-do (KR); Jun-Ho Jeong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 236 days.

(21) Appl. No.: 12/358,936

(22) Filed: Jan. 23, 2009

(65) Prior Publication Data
US 2009/0135642 A1    May 28, 2009

Related U.S. Application Data

(62) Division of application No. 11/527,271, filed on Sep. 26, 2006, now Pat. No. 7,495,984.

(30) Foreign Application Priority Data

Dec. 15, 2005   (KR) .............................. 2005-0124033

(51) Int. Cl.
*G11C 11/00* (2006.01)
(52) U.S. Cl. .................. 365/148; 365/230.05; 365/205; 365/210.1

(58) Field of Classification Search .................. 365/148, 365/205, 230.03, 210.1
See application file for complete search history.

(56) References Cited

U.S. PATENT DOCUMENTS

| | | | |
|---|---|---|---|
| 5,432,731 A | 7/1995 | Kirsch et al. |
| 5,753,946 A | 5/1998 | Naiki et al. |
| 5,999,439 A | 12/1999 | Seyyedy |
| 6,246,622 B1 | 6/2001 | Sugibayashi |
| 6,269,040 B1 | 7/2001 | Reohr et al. |
| 6,317,376 B1 | 11/2001 | Tran et al. |
| 6,426,907 B1 | 7/2002 | Hoenigschmid |
| 6,490,217 B1 | 12/2002 | DeBrosse et al. |
| 6,504,751 B2 | 1/2003 | Poechmueller |
| 6,738,285 B2 | 5/2004 | Tanizaki et al. |
| 6,757,191 B2 | 6/2004 | Ooishi et al. |
| 6,778,426 B2 | 8/2004 | Hosotani |

(Continued)

FOREIGN PATENT DOCUMENTS

DE      103 04 453 A1    8/2003

(Continued)

OTHER PUBLICATIONS

Notice of Allowability for Korean Patent Application No. 10-2005-0124033; May 28, 2007.

(Continued)

*Primary Examiner* — Tuan T. Nguyen
(74) *Attorney, Agent, or Firm* — Myers Bigel Sibley & Sajovec, P.A.

(57) ABSTRACT

A Resistance based Random Access Memory (ReRAM) can include a sense amplifier circuit that includes a first input coupled to a bit line of a reference cell in a first block of the ReRAM responsive to a read operation to a second block.

8 Claims, 18 Drawing Sheets

U.S. PATENT DOCUMENTS

| | | |
|---|---|---|
| 6,795,340 B2 | 9/2004 | Sakimura et al. |
| 6,839,269 B2 | 1/2005 | Iwata et al. |
| 6,870,759 B2 | 3/2005 | Tsang |
| 6,982,908 B2 | 1/2006 | Cho |
| 7,027,342 B2 | 4/2006 | Inoue |
| 7,116,598 B2 | 10/2006 | Shimizu et al. |
| 7,286,378 B2 | 10/2007 | Nazarian |
| 7,313,043 B2 | 12/2007 | Gogl et al. |
| 2003/0235071 A1 | 12/2003 | Okazawa |
| 2004/0233709 A1 | 11/2004 | Tsuchida et al. |
| 2005/0036376 A1 | 2/2005 | Iwata et al. |
| 2005/0105329 A1 | 5/2005 | Nazarian |
| 2005/0128793 A1 | 6/2005 | Ho et al. |
| 2006/0062066 A1 | 3/2006 | Garni |
| 2010/0054020 A1* | 3/2010 | Ueda ............................ 365/148 |
| 2010/0195415 A1* | 8/2010 | Seko ........................ 365/189.09 |
| 2010/0271861 A1* | 10/2010 | Kitagawa ..................... 365/148 |

FOREIGN PATENT DOCUMENTS

| | | |
|---|---|---|
| JP | 02-110895 | 4/1990 |
| JP | 09/097496 | 4/1997 |
| JP | 2003-257177 | 9/2003 |
| JP | 2004-23062 A | 1/2004 |
| KR | 10-2002-0003296 A | 1/2002 |
| KR | 10-0449067 | 1/2002 |
| KR | 10-2003-0097697 | 12/2003 |
| KR | 10-2005-0004160 A | 1/2005 |

OTHER PUBLICATIONS

M. Durlam et al; *IEEE* 2002 Symposium on VLSI Circuits Digest of Technical Papers; pp. 158-161.

John DeBrosse et al.; *A High-Speed 128-kb MRAM Core for Future Universal Memory Applications*; IEEE Journal of Solid-State Circuits, vol. 39. No. 4; Apr. 2004, pp. 678-683.

Korean Office Action for corresponding Korean Patent Application No. 10-2005-0124033, 2 pages, (Nov. 20, 2006).

Taiwanese First Office Action and English translation (12 pages) corresponding to Taiwanese Patent Application No. 095141271; Issue Date: Jun. 12, 2009.

Taiwanese First Office Action and English translation (18 pages) corresponding to Taiwanese Patent Application No. 095141271; Dated: Dec. 17, 2008.

Notice of Allowability for Korean Patent Application No. 10-2005-0107178; May 31, 2007.

Taiwanese Preliminary Notice of First Office Action and English translation (5 pages) corresponding to Taiwanese Patent Application No. 095146843; Issue Date: Jul. 13, 2009.

German Office Action corresponding to German Patent Application No. 10 2006 053 744.0 dated Oct. 12, 2010; 7 pages.

Taiwanese Office Action corresponding to Taiwan Patent Application No. 095146843 dated Dec. 3, 2009; 13 pages.

* cited by examiner

RESISTIVE MEMORY DEVICES INCLUDING SELECTED REFERENCE MEMORY CELLS OPERATING RESPONSIVE TO READ OPERATIONS

CROSS-REFERENCE TO RELATED APPLICATIONS

The present application is a Divisional Application of U.S. patent application Ser. No. 11/527,271, filed in the United States Patent Office on Sep. 26, 2006 now U.S. Pat. No. 7,495,984, and claims priority to Korean Patent Application No. 2005-0124033, filed in the Korean Intellectual Property Office on Dec. 15, 2005, the disclosures of which are incorporated herein by reference.

FIELD OF THE INVENTION

The present invention relates generally to integrated circuits and, more particularly, to resistive memory devices.

BACKGROUND

Resistive based memory devices (ReRAMs), such as magnetic random access memory (MRAM), phase changeable random access memory (PRAM), resistance random access memory (RRAM), etc. can store data by programming the resistance of cells included therein. For example, an MRAM can store a logical data value of "zero" by programming a data cell to have a relatively low resistance or can store a logical data value of "one" by programming the data cell to have a relatively high resistance as shown in FIG. 1.

As further shown in FIG. 1, the resistance values provided by the different values stored therein can be distributed over a range so that different memory cells exhibit different levels of resistance even though those different memory cells are programmed with the same logical data values.

When the data is read from the data cell, the programmed value can be determined by essentially comparing the programmed resistance to a reference resistance. The programmed resistance and reference resistance can actually be provided by respective currents (i.e., currents that correspond to the logical data value stored in the cell as well as the reference). Accordingly, when the data cell is read, circuitry in the MRAM can determine the level of resistance provided by the data cell being read, based on the current, to output the logical data value stored therein. MRAMs are further discussed in, for example, Durlam et al. "A low power 1 Mbit MRAM based on 1T1MTJ bit cell integrated with Copper Interconnects" 2002 *Symposium on VLSI Circuits Digest of Technical Papers* 158-161 (2002). MRAMs are also discussed in, for example, Debrosse et al. "A High-Speed 128-kb MRAM Core for Future Universal Memory Applications" *IEEE Journal of Solid*-State Circuits 39(4):678-683 (2004).

One conventional way of determining the logical data values stored in an MRAM is discussed, for example, in U.S. Pat. No. 6,982,908 to Cho. The approach discussed in Cho uses reference cells that are programmed to store both a logical data value of zero and a logical data value of one. These reference cells are placed in parallel with one another so that a current provided by the combination (i.e., the reference current) should ideally have a value that is the midpoint between a current corresponding to a logical data value of one and a current corresponding to a logical data value of zero, as shown, for example, in FIG. 2. For example, as shown in FIG. 2 of Cho, each of the wordlines includes a pair of reference cells where one of the pair is programmed with a logical data value of one, whereas the other reference cell in the pair is programmed with a logical data value of zero so that the combination of the two can provide a midpoint therebetween as a reference.

One of the drawbacks associated with this type of approach is that the actual current generated by reading the data cell (and the reference cell) can vary based on a bias voltage provided thereto, as shown in FIG. 3. The Cho patent cited above also discussed an approach to reduce the effects of biasing by including two reference cells for each wordline activated for read operations, as shown, for example, in FIG. 3 of Cho.

FIG. 4 is a conventional sense amplifier circuit (S/A) that can be used to determine data values stored in the MRAM cells using reference currents. In particular, a parallel arrangement of reference cells can be programmed so that half of the cells store a logical data value of zero whereas the remaining half store a logical data value of one to provide a reference current $I_{ref}$ that should ideally be at a midpoint between the currents associated with different logical data values, as shown in FIG. 5.

According to FIGS. 4 and 5, when a data cell is accessed, a current $I_{cell}$ is provided to a first input of the sense amplifier, whereas the reference current $I_{ref}$ is provided to the second input of the sense amplifier. The sense amplifier compares the voltages developed in response to the respective currents and produces a difference at the output thereof based essentially on the comparison between the reference current and the current actually provided by accessing the particular memory cell. As shown in FIG. 5, the currents provided by the data cells (and the currents provided by the reference cells) can be spread over respective ranges.

SUMMARY

Embodiments according to the invention can provide resistive memory devices including selected reference memory cells. Pursuant to these embodiments, a Resistance based Random Access Memory (ReRAM) can include a sense amplifier circuit that includes a first input coupled to a bit line of a reference cell in a first block of the ReRAM responsive to a read operation to a second block.

DESCRIPTION OF THE EMBODIMENTS ACCORDING TO THE INVENTION

Figure 1:
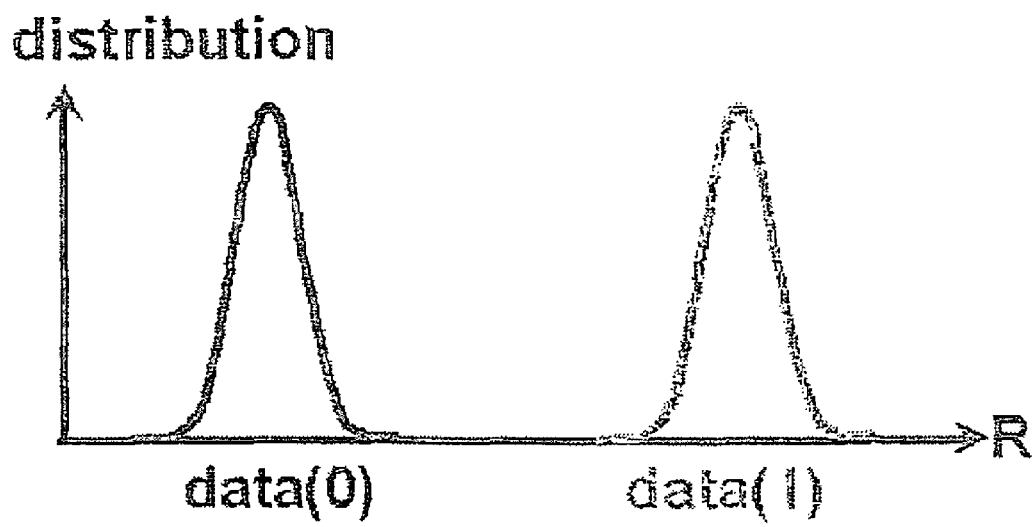
FIG. 1 is a graphical depiction of different resistance levels provided by cells storing logical data values of zero or logical data values of one.
Figure 2:
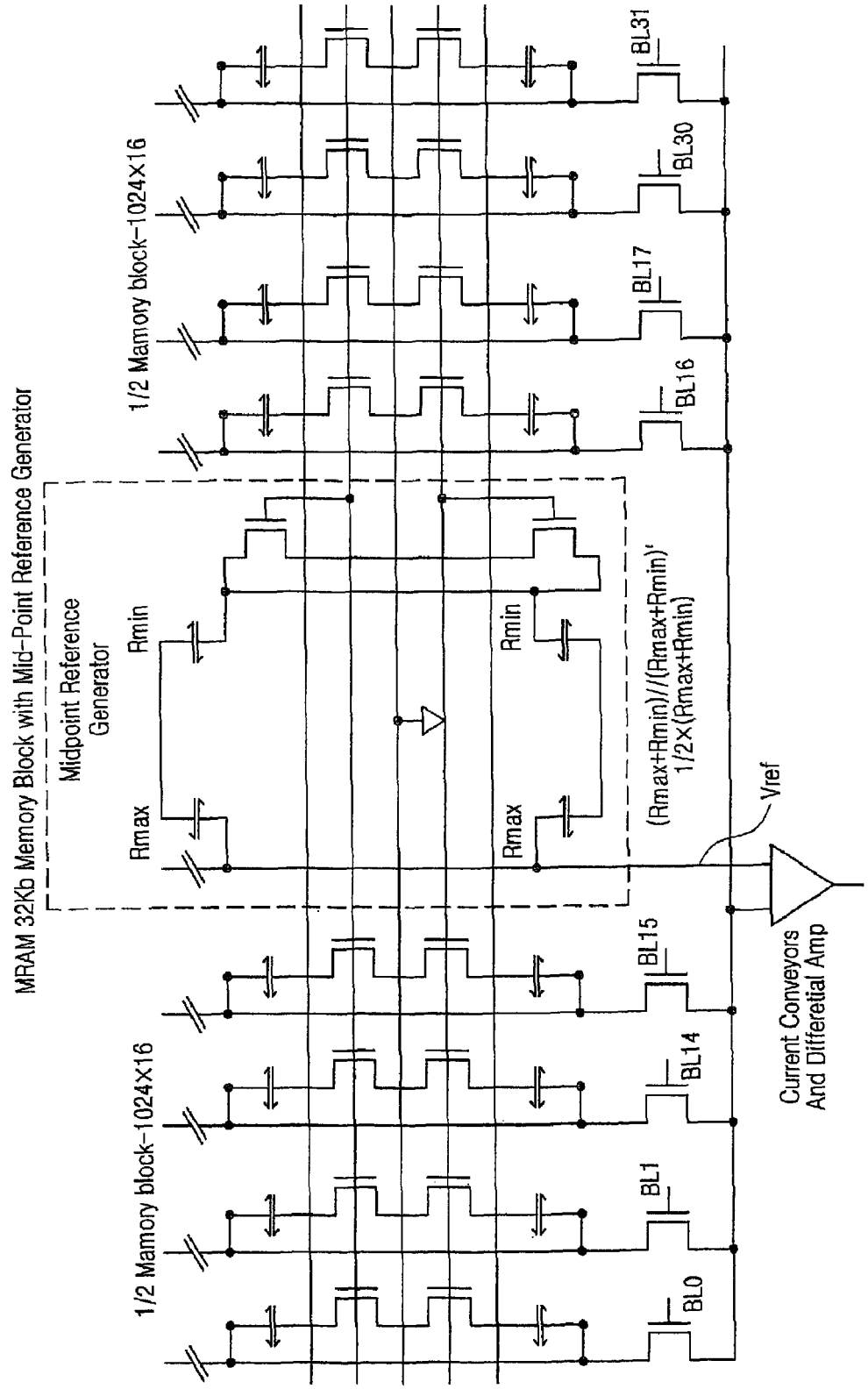
FIG. 2 is a circuit of a conventional MRAM including two reference cells.
Figure 3:
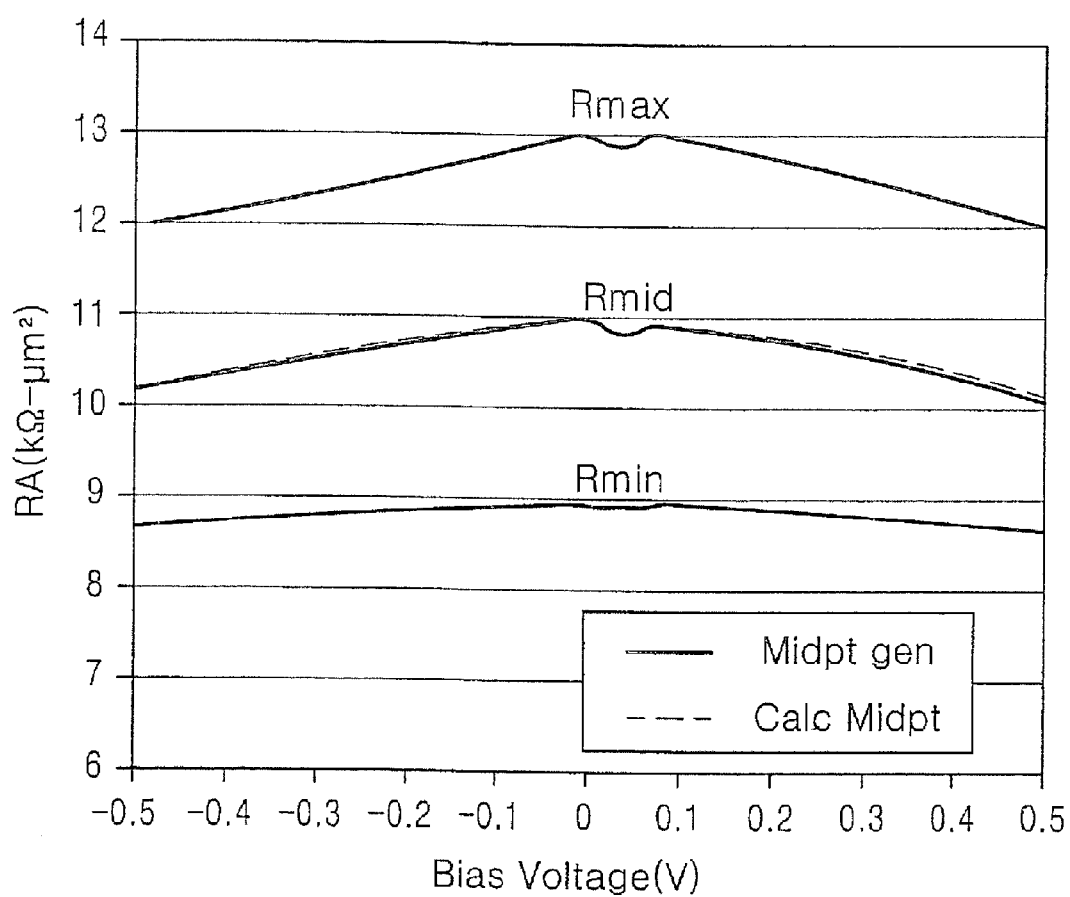
FIG. 3 is a graph that illustrates variation in resistances associated with reference cells as a function of voltage biasing provided thereto.
Figure 4:
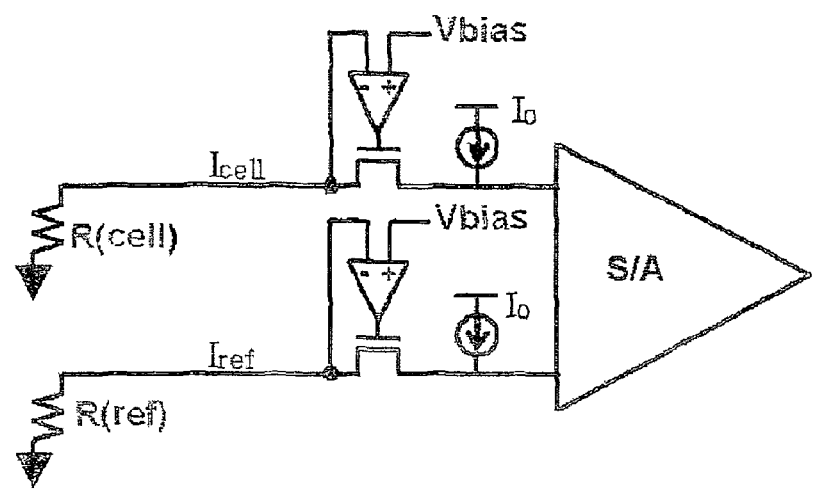
FIG. 4 is a circuit schematic of a conventional sense amplifier circuit used to compare currents provided by data cells and reference cells.
Figure 5:
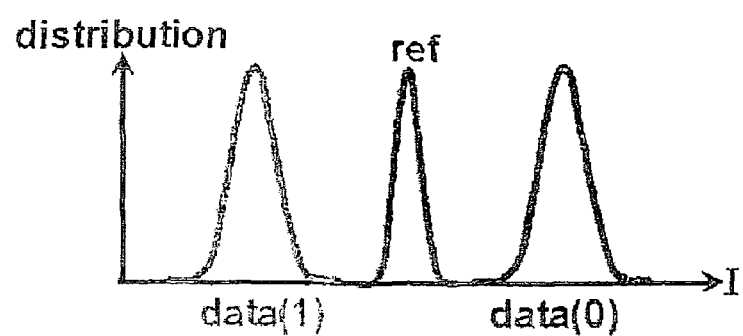
FIG. 5 is a graphical illustration of currents provided by data cells storing logical data values of one and zero as well as reference currents provided by reference cells that are approximately midway between the current levels provided by the data cells.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described hereinbelow in greater detail, embodiments according to the invention can provide for at least three ReRAM reference cells coupled in parallel with one another and configured to provide a reference current to respective ReRAM sense amplifier circuits. For example, circuits according to some embodiments of the invention can provide a relatively large number of reference cells where half are programmed with a logical data value of zero and half are programmed with a logical data value of one so that the parallel combination can provide a reference current that approximates a midpoint between reference currents associated with the logical data values of zero. Furthermore, the reference current may be less subject to process variation as the greater number of reference cells may provide a more accurate representation of a true midpoint between the data values.

In some embodiments according to the invention, when a read operation is performed to a first block of memory, reference cells in a second block of memory are used to provide a reference current to the sense amplifier used to read the data from the first block of memory. In still other embodiments according to the invention, either of the inputs of the sense amplifier circuits can be used to provide the reference current. In particular, the inputs of the sense amplifier circuits may be coupled to reference block select transistors that are configured to couple together the inputs of the sense amplifier circuits that are to be provided with the reference current.

Furthermore, the input of the sense amplifier circuit that is to be coupled to the other inputs can be responsive to the block of memory to which the read operation is directed. Accordingly, a read to a first block of memory can result in data being provided to a first set of inputs of the sense amplifier circuits whereas the remaining inputs of the sense amplifier circuits are coupled to reference cells in a second block of memory.

In still other embodiments according to the invention, reference cells from different blocks can be coupled together in response to a read operation to a memory block that is outside those blocks that are coupled together. In other words, a read to a particular block of memory can result in reference cells from blocks other than that to which the read is directed being coupled together.

In still further embodiments according to the invention, a current reference circuit can include a number of reference cells that are configured to provide respective reference currents upon activation to a sense amplifier. The amounts of current provided by the reference cells can have an unequally weighted distribution of resistance values. In other words, in some embodiments according to the invention, the number of reference cells used to store logical data values of one may be unequal to the number of reference cells used to store a data value of zero. Accordingly, the reference circuit may be configured to compensate for a particular distribution of values provided by data cells that may be caused by particular process parameters.

In still other embodiments according to the invention, the current reference circuit may be configured so that all the reference cells store equal data values to provide substantially equal reference currents to the sense amplifier circuits coupled thereto.

Figure 6:
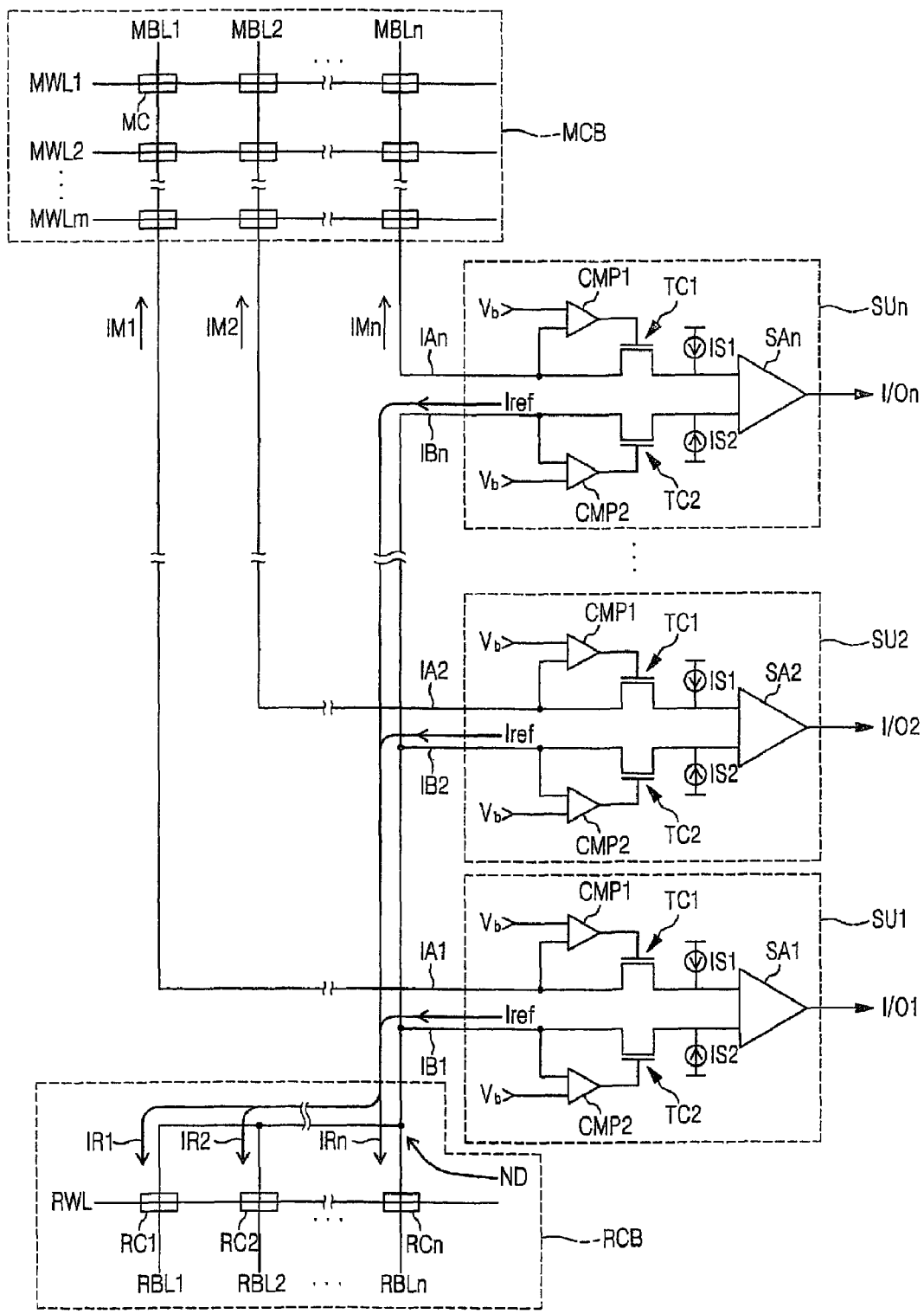
FIG. 6 is a circuit schematic that illustrates sense amplifier circuits coupled to data cells and current reference cells according to some embodiments of the invention.

FIG. 6 is a circuit schematic that illustrates sense amplifier circuits coupled to data cells and current reference cells according to some embodiments of the invention. According to FIG. 6, a memory block MCB includes a plurality of data cells MC that are configured to store data for subsequent retrieval during read operations performed thereto. In particular, the data stored in the data cells MC can be accessed through biasing of wordlines MWL1-M and bitlines MBL1-N which are coupled to the data cells MC.

It will be understood that the data cells MC are configured to store logical data values based on resistive properties, such as those provided in magnetic random access memories, phase changeable random access memories, etc. Accordingly, logical data values, such as one and zero, can be stored in the data cells MC as different resistances so that upon a read operation the logical data values can be determined based on the current which flows to/from the data cells MC when the proper biasing is applied to the wordlines and bitlines coupled thereto.

It will be further understood that although the discussion herein discusses the storage and retrieval of single bit data in/from the data cells MC, the data cells may actually represent multi-bit storage cells. In a multi-bit arrangement, at least two bits of data are stored per memory cell. For example, in a 2-bit memory cell configuration, the status of information stored in each memory cell may be "00", "01", "10" or "11". Furthermore, each memory cell may be programmed to have a threshold voltage determined as one of four different values. Accordingly, such a multi-bit memory device can store two bits in the same area as a one-bit memory device while using the number of memory cells corresponding to half the number of memory cells required in the one-bit memory device for that amount of information. Therefore, the chip size is correspondingly reduced for storage of a given amount of information, as compared to the one-bit memory device. As the number of bits stored per memory cell increases, the capacity of the multi-bit memory device increases correspondingly as compared to that of the one-bit memory device. Multi-bit storage cells are described further in, for example, U.S. Pat. No. 6,118,696, entitled Multi-bit memory cell array of a non-volatile semiconductor memory device and method for driving the same, the entirety of which is incorporate herein by reference.

As further shown in FIG. 6, sense amplifier circuits SU1-N include two inputs where one of the inputs is coupled to a respective bitline from the data cells MC in the memory block MCB. For example, sense amplifier circuit SU1 includes a first input IA1 that is coupled to the bitline MLB1, which is also coupled to the first column of data cells MC in the memory block MCB. Furthermore, an input of the sense amplifier circuit SU2, referred to as IA2, is coupled to the bitline MLB2 in the second column of data cells MC in the memory block MCB. As further shown in FIG. 6, a second input to each of the sense amplifier circuits SU1-n is coupled to a node ND. Any number of sense amplifier circuits SU can be used where each of the sense amplifier circuits is coupled to a respective bitline used to access a column in the memory block MCB.

As further shown in FIG. 6, a reference current circuit RCB is configured to include at least three reference memory cells RC1-RCn coupled in parallel with one another to the node ND where each of the reference cells RC1-n is coupled to a reference wordline RWL. Furthermore, each of the reference cells RC1-n is coupled to a respective reference bitline RBL1-n which can be used (in combination with the reference wordline RWL) to activate the reference cells RC1-n in the current circuit RCB.

In operation, a row of data cells MC in the memory block MCB can be accessed by biasing the appropriate combination of wordlines MWL1-m and bitlines MLB1-n. For example, to access the first row of data cells MC in the memory block MCB, the wordline MWL1 can be activated and a bias voltage applied to each of the bitlines MBL1-n to access the logical data values stored in the first row of data cells MC. Accordingly, currents IM1-n can be provided responsive to activation of the appropriate row of data cells MC during a read operation. Each of the currents IM1-n provided in response to the read can be proportional to the resistance provided by the respective data cell MC to which the input is connected during the read operation.

During the read operation, the reference current circuit RCB can be activated by biasing of the reference word line RWL and the reference bit lines RBL1-n to provide substantially equal reference currents $I_{ref}$ sourced from each of the respective inputs to the sense amplifier circuits SU1-n, The reference currents $I_{ref}$ are divided among the at least three reference cells coupled in parallel with one another, which are shown in FIG. 6 as reference currents IR1-IRn.

In response, each of the sense amplifier circuits SU1-SUn compares the voltage levels provided to the inputs of the sense amplifier SA1-n that are proportional to the reference current and the current IM1-n that is sourced by the respective sense amplifier circuit SU1-n. In particular, each input of the sense amplifiers SA1-SAn is coupled to respective constant current sources IS1 and IS2 that can be accessed through operation of a pair of control transistors TC1 and TC2 that operate responsive to an output of a pair of comparators CMP1 and CMP2. The comparators CMP1 and CMP2 each compare the voltage developed by the respective current $I_{ref}$ and IM1-n to a bias voltage $V_b$ to provide operation of the control transistors TC1 and TC2.

The comparators CMP1 and CMP2 compare the voltage at the input (either the input coupled to the reference cells or the input connected to the data cells) to the bias voltage $V_b$ and if the input voltage is less than the bias voltage $V_b$, the output of the comparator increases so that a drain current in the control transistor TC1 or TC2 supplied by the constant current source IS1 or IS2 is increased thereby raising the voltage level presented at the input. If, on the other hand, the voltage developed at the input from the data cells MC is greater than the bias voltage $V_b$, the output of the comparator CMP1 or CMP2 decreases so that the drain current of the control transistor TC1 or TC2 decreases to reduce the voltage present at the input of the sense amplifier circuit SU1-$n$. It will be understood that although the operation of the circuits included in the sense amplifier circuit SU1-SUn are described above with reference to inputs coupled to the data cells MC, the operations of the circuits coupled to the reference cells can be analogous.

According to FIG. 6, the reference cells RC1-RCn included in the reference current circuit RCB can be configured so that half of the reference cells RC1-RCn are programmed to have a logical data value of zero, whereas the remaining reference cells RC1-RCn (i.e., the other half) are programmed to have a logical data value of one. Accordingly, the combined reference currents $I_{ref}$ provided to/from the sense amplifier circuit SU1-$n$ are divided among the reference cells that are coupled in parallel with one another.

Because an increased number of reference cells RC1-$n$ can be provided in the reference current circuit RCB, the distribution range of the current $I_{ref}$ can be narrower, thereby enabling an improvement in the operating margin of the sense amplifier circuits SU1-$n$, which may further allow a more accurate determination of the data that is stored in the data cells MC.

Figure 7:
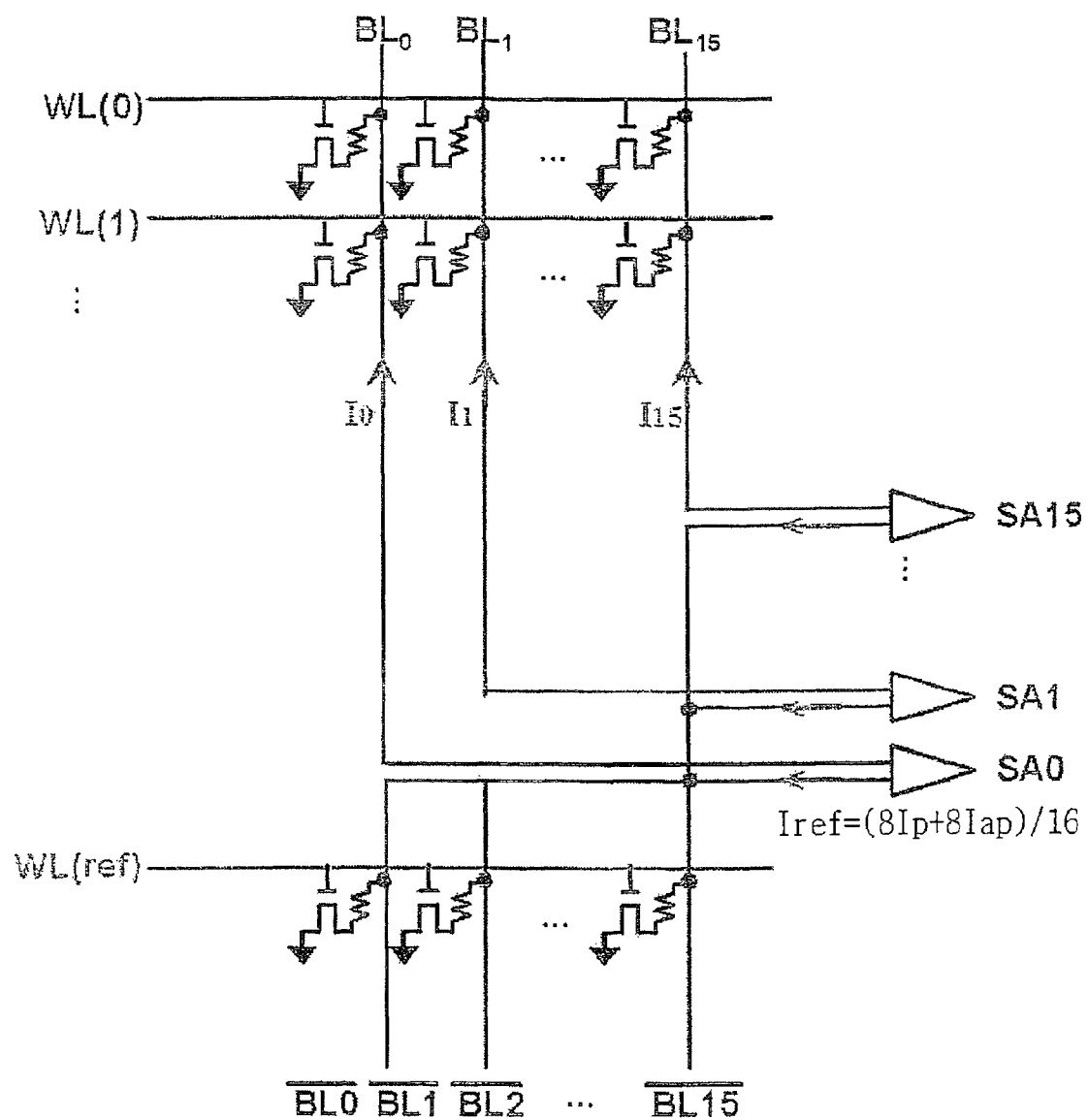
FIG. 7 is a simplified equivalent circuit that represents sense amplifier circuits coupled to reference cells/data cells using access transistors according to some embodiments of the invention.

FIG. 7 is a simplified equivalent circuit that represents sense amplifier circuits coupled to reference cells/data cells using access transistors according to some embodiments of the invention. In particular, the data cells and reference cells are represented by the resistive elements coupled to the wordlines and bitlines WL/BL and reference wordline WLref and respective bitlines $\overline{BL}$0-15 as shown in FIG. 6. In operation, the wordlines (both the wordlines used to activate the data cells as well as the wordline $WL_{ref}$ used to activate the reference cells) are coupled to access transistors which are in turn coupled to the respective data cells/reference cells. Accordingly, the circuits described herein can operate in conjunction with access transistors as shown in FIG. 7 when the appropriate biasing is applied to the wordlines and bitlines.

Figure 8:
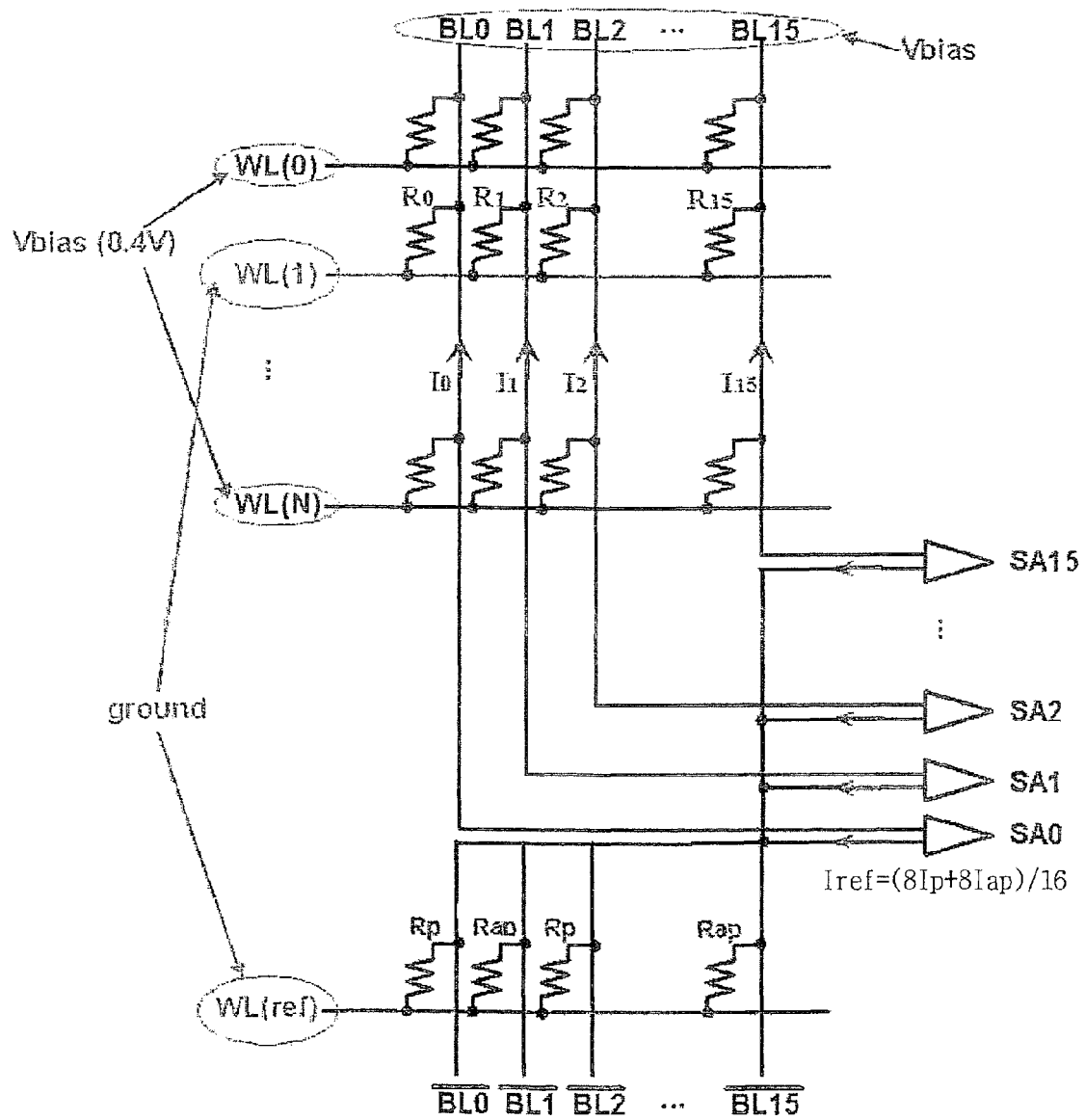
FIG. 8 is an equivalent circuit showing a "crosspoint" configuration where the resistive elements represent the data cells and reference cells according to some embodiments of the invention.

FIG. 8 is an equivalent circuit showing a "crosspoint" configuration where the resistive elements represent the data cells and reference cells as shown in FIG. 6. In operation, the biasing of the wordlines coupled to the data cells along with the biasing provided to the bit lines BL0-BL15 can provide for access to the data stored in the data cells. Similarly, the reference cells can be activated responsive to biasing of the reference wordline WLref along with the bitlines $\overline{BL0\text{-}15}$. For example, in some embodiments according to the invention, the selected wordline WL/$WL_{ref}$ can have a ground voltage applied thereto while a bias voltage (of about 0.4V) is applied to the un-selected wordlines WL in conjunction with the bias voltage being applied to the bitlines.

Figure 9:
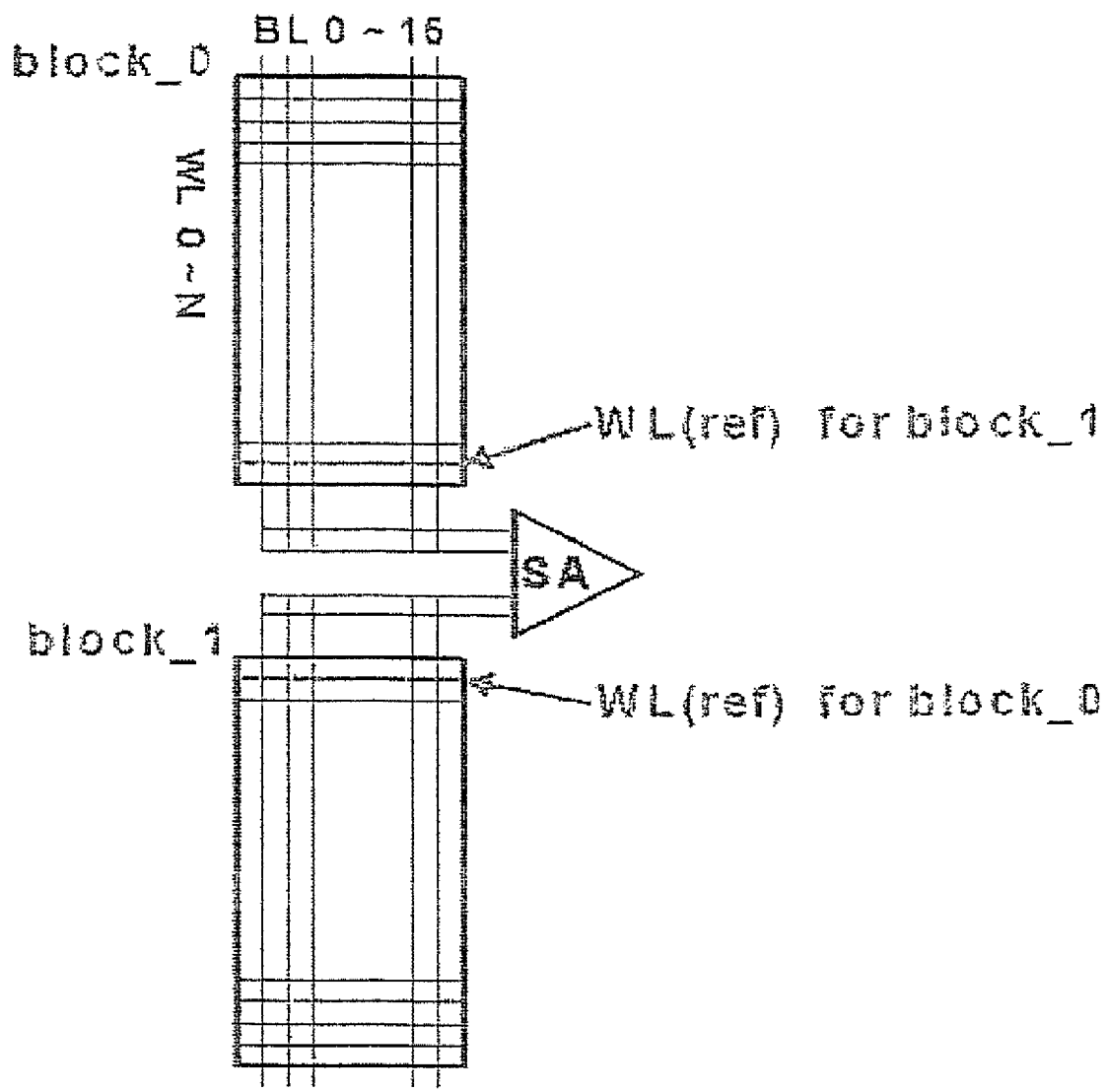
FIG. 9 is a schematic representation of a sense amplifier circuit selectively coupled to reference cells in different memory blocks according to some embodiments of the invention.

FIG. 9 is a schematic representation of a sense amplifier circuit selectively coupled to reference cells in different memory blocks according to some embodiments of the invention. According to FIG. 9, the sense amplifier circuit SA is coupled to data cells and reference cells in both block 0 and in block 1. In operation, the sense amplifier circuit SA can be coupled to the reference cells included in block 0 responsive to a read operation directed to data cells in block 1. Similarly, the sense amplifier circuit can be selectively coupled to reference cells included in block 1 responsive to a read operation directed to data cells in memory block 0.

Figure 10:
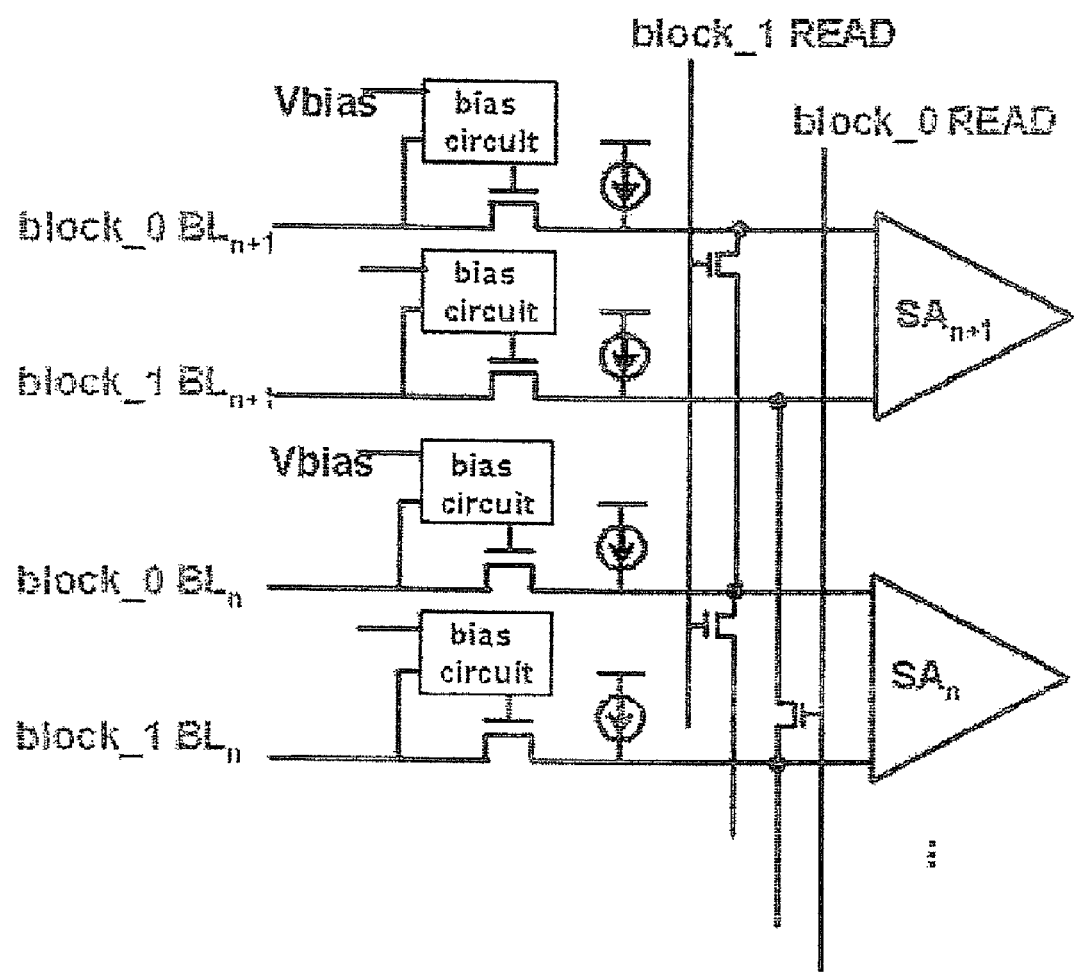
FIG. 10 is a simplified schematic illustration of sense amplifier circuits including control transistors coupled to inputs thereof according to some embodiments of the invention.

FIG. 10 is a simplified schematic illustration of sense amplifier circuits including control transistors coupled to inputs thereof. In particular, a first input of the sense amplifier circuits SA are coupled to control transistors which operate under control of a signal indicating a read to block 1. The remaining inputs of the sense amplifier circuits SA are coupled together to control transistors that operate responsive to a signal indicating a read to block 0. In operation, when a read operation is directed to block 1, the upper inputs of the sense amplifier circuits can be coupled together to reference cells included in block 0. In contrast, when a read operation is directed to block 0, the lower inputs of the sense amplifier circuits are coupled together to reference cells included in block 1. Accordingly, a read operation directed to a particular block can cause the other inputs to the sense amplifier circuit to be coupled to reference cells in a memory block other than the block to which the read is directed.

Figure 11:
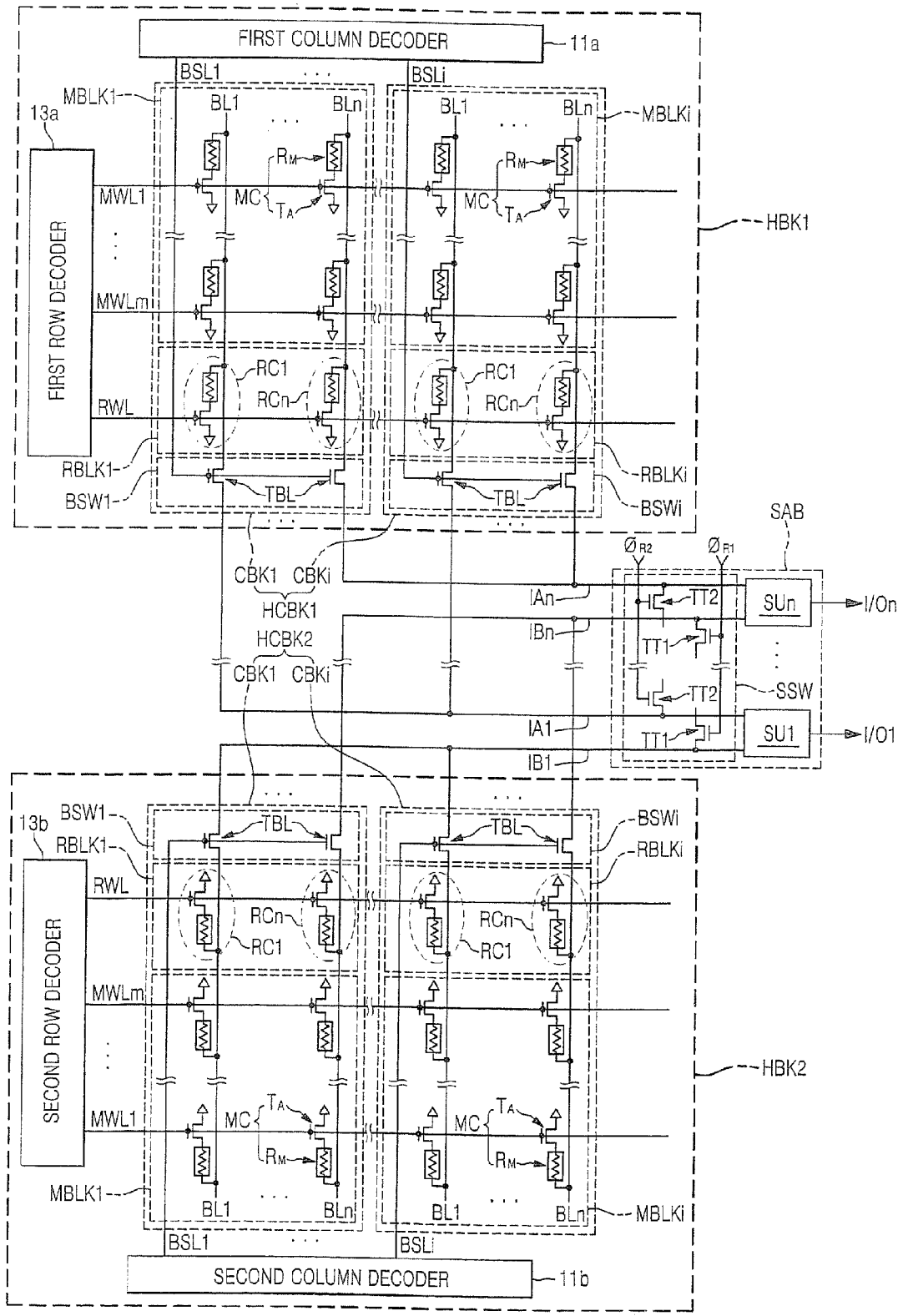
FIG. 11 is a schematic illustration of memory blocks including data cells and reference cells according to some embodiments of the invention.

FIG. 11 is a schematic illustration of memory blocks including data cells and reference cells according to some embodiments of the invention. According to FIG. 11, a first half block HBK1 and a second half block HBK2 each include respective row and column decoders used to activate the data cells and reference cells associated therewith. For example, a first row decoder 13A and a first column decoder 11A are used to activate data cells and reference cells included in memory blocks MBLK1-MBLKi included in the first half block of HBK1.

As further shown in FIG. 11, a sense amplifier block SAB includes sense amplifier circuits SU1-$n$ which provide input/outputs 1-$n$ respectively. The sense amplifier circuits SU1-$n$ are coupled to data cells and reference cells included in the half blocks HBK1 and HBK2.

As further shown in FIG. 11, the data cells and reference cells are coupled to respective access transistors that are used to activate the data cell/reference cell associated therewith. For example, the data cells included in the first row of the half block HBK1 can be activated by the wordline ML1 and bitlines BL1-$n$ for all memory blocks MBLK1-MBLKi. Furthermore, the reference cells RC1-RCn including memory blocks MBLK1-MBLKi are also controlled by respective access transistors coupled thereto.

In operation, as discussed above in reference to FIGS. 9 and 10, a read operation to one of the half blocks HBK1/HBK2 can result in one of the inputs to the sense amplifier circuits SU1-SUn being coupled to reference cells in the other half block HBK1/HBK2. For example, a read to half block HBK1 results in data cells included in MBLK1-MBLKi being activated by appropriate biasing of the wordlines and bitlines coupled thereto to provide inputs to the sense amplifier circuits SU1-SUn.

Figure 12:
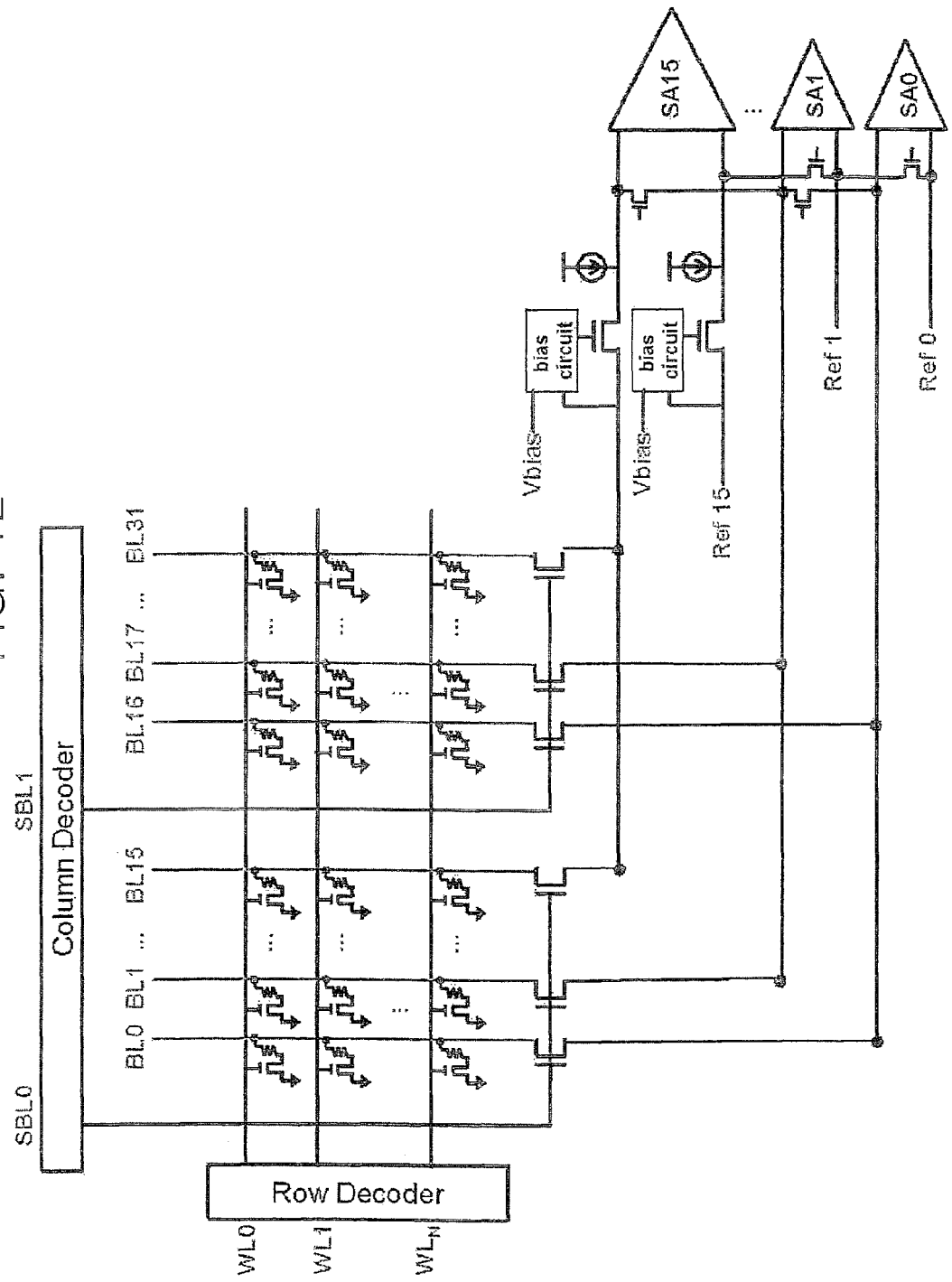
FIG. 12 is a simplified equivalent circuit of memory blocks including data cells and reference cells shown in FIG. 11 according to some embodiments of the invention.

It will be understood that the control signal $Ø_{R1}$ designates a read to the first half block HBK1 so that the remaining inputs to the sense amplifier circuits SU-SUn are coupled to reference cells in the second half block at HBK2. In particular, the reference wordline provided by the second row decoder 13B along with the bitlines BSL1-$n$ (for both MBLK1 and MBLKi in HBK2) are used to activate the reference cells included therein. Accordingly, FIG. 11 can illustrate the use of reference cells included in memory blocks other than those to which a read operation is directed while employing access transistors to the activation of data cells and reference cells as described above in reference to FIGS. 9 and 10, and as shown in a simplified equivalent circuit of FIG. 12.

Figure 13:
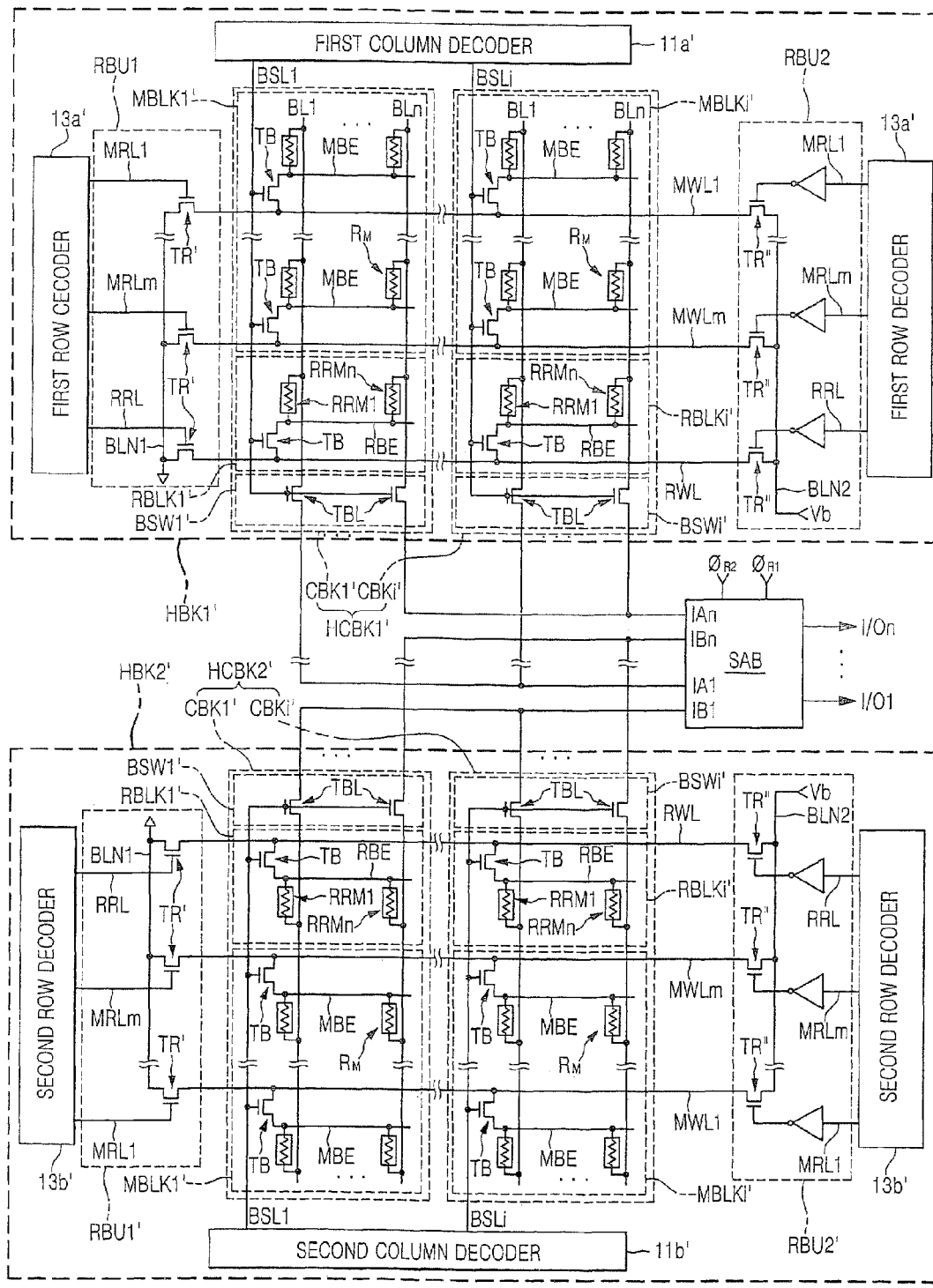
FIG. 13 is a schematic illustration of a resistive random access memory device wherein the data cells and reference cells are shown in a "crosspoint" configuration according to some embodiments of the invention.

FIG. 13 is a schematic illustration of a resistive random access memory device wherein the data cells and reference cells are shown in a "crosspoint" configuration as described in, for example, FIG. 8. For example, according to FIG. 13, data cells included in a first row of the half block HBK1' are coupled to bitlines BL1-$n$ (for both MBLK1' and MBLKi' and are coupled to a block switching transistor TB and to a row bias unit RBU1 for providing the proper biasing thereto in response to, for example, a read operation.

Figure 14:
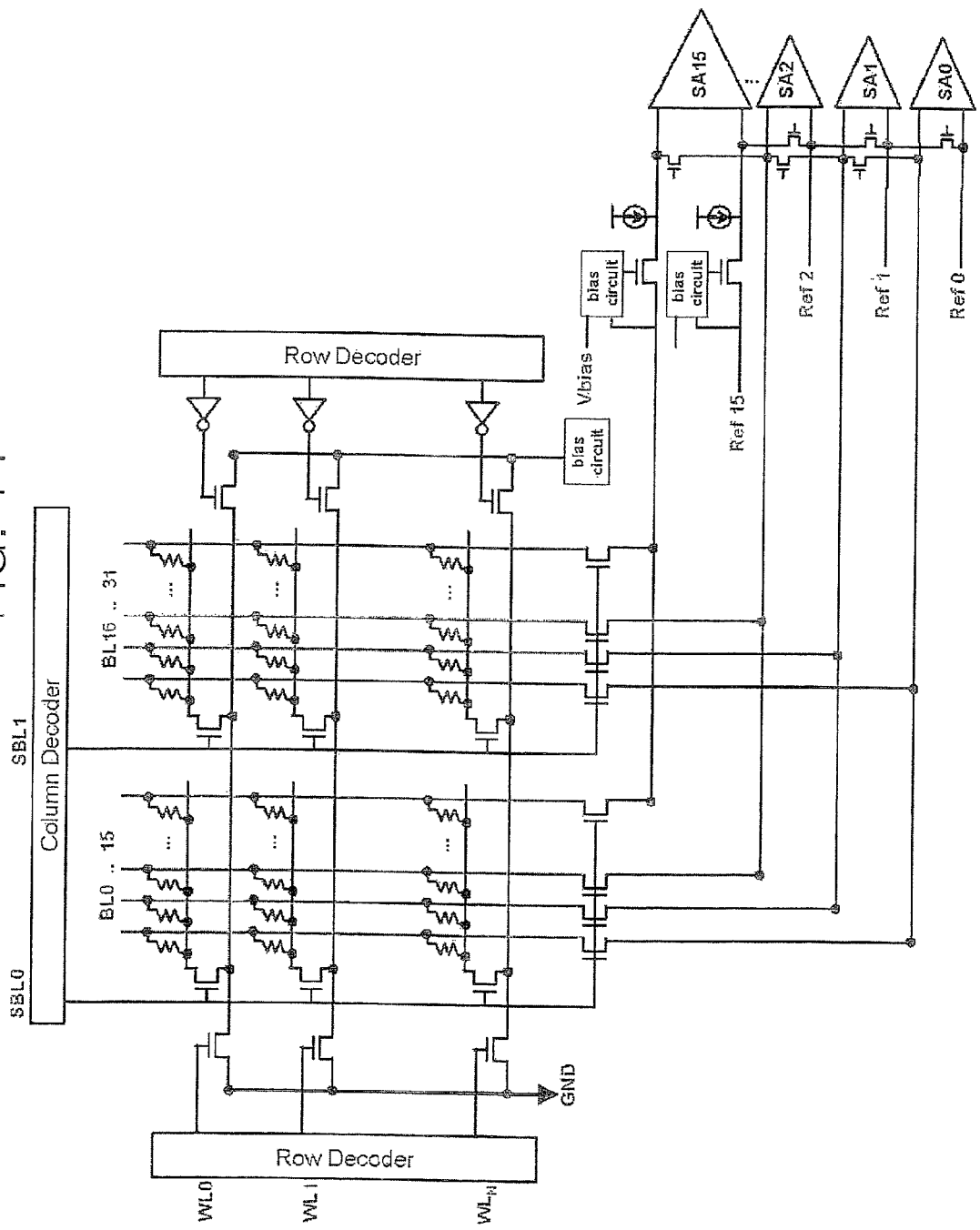
FIG. 14 is a simplified equivalent circuit showing the sense amplifier circuits SA0-15 in FIG. 13 according to some embodiments of the invention.

In operation, the sense amplifier circuits included in the sense amplifier block SAB can be provided with data from the data cells from one of the half blocks HBK1'/HBK2' while being coupled to reference cells included in the other half block HBK1'/HBK2', which is illustrated in equivalent simplified FIG. 14 showing the sense amplifier circuits SA0-15 being provided with data 0-31 from data cells 0-15 in each of the memory blocks MBLK1' and MBLK2' where each of the MBLK1/2 includes sixteen data cells. Accordingly, the sense amplifier circuits SA0-SA15 are also coupled to reference cells 0-15 included in HBK2' responsive to the read to HBK1'.

Figure 15:
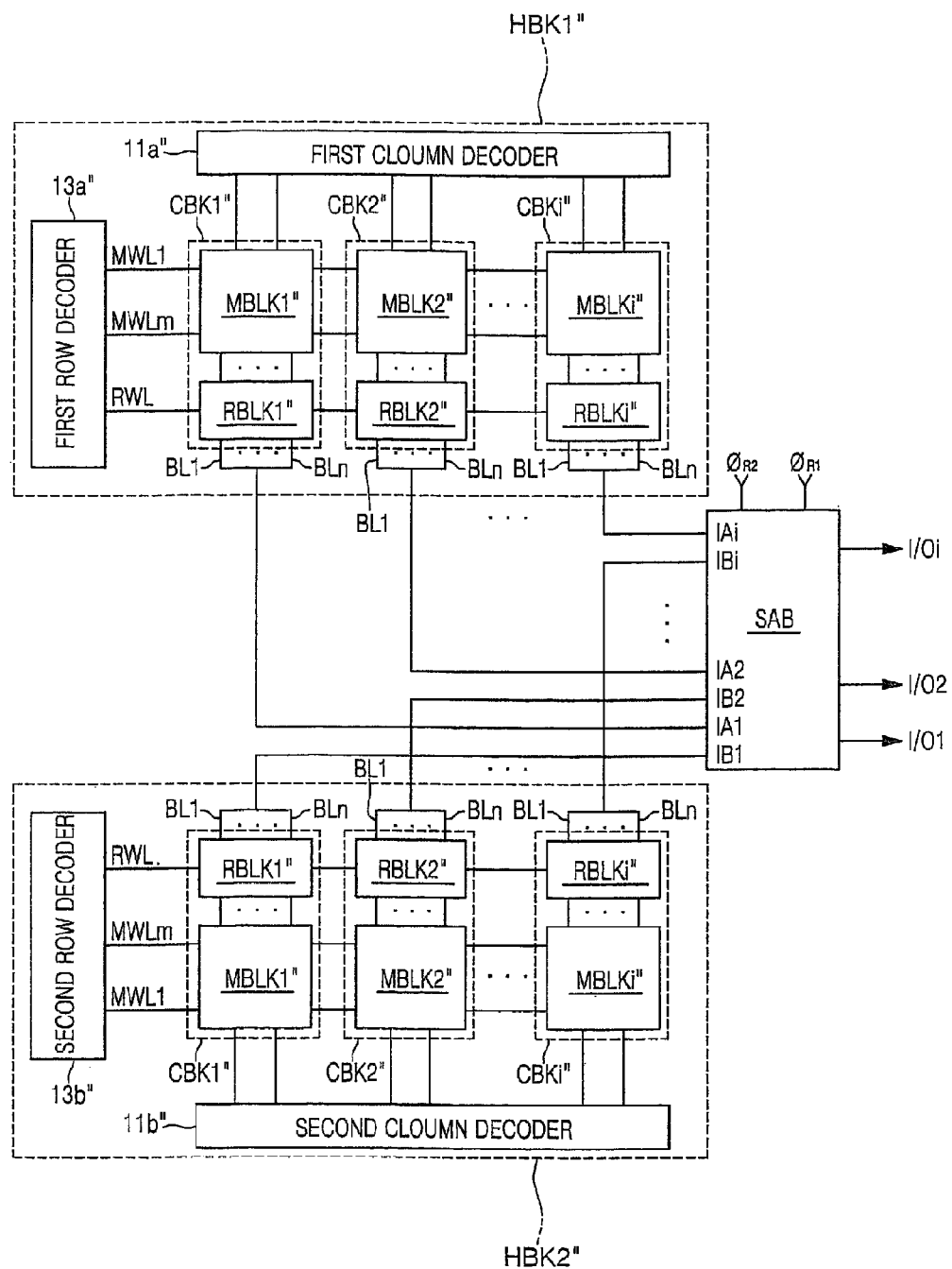
FIG. 15 is a schematic illustration of memory blocks 0-7 and memory blocks 8-15 coupled to inputs of sense amplifier circuits SA0-7 according to some embodiments of the invention.
Figure 16:
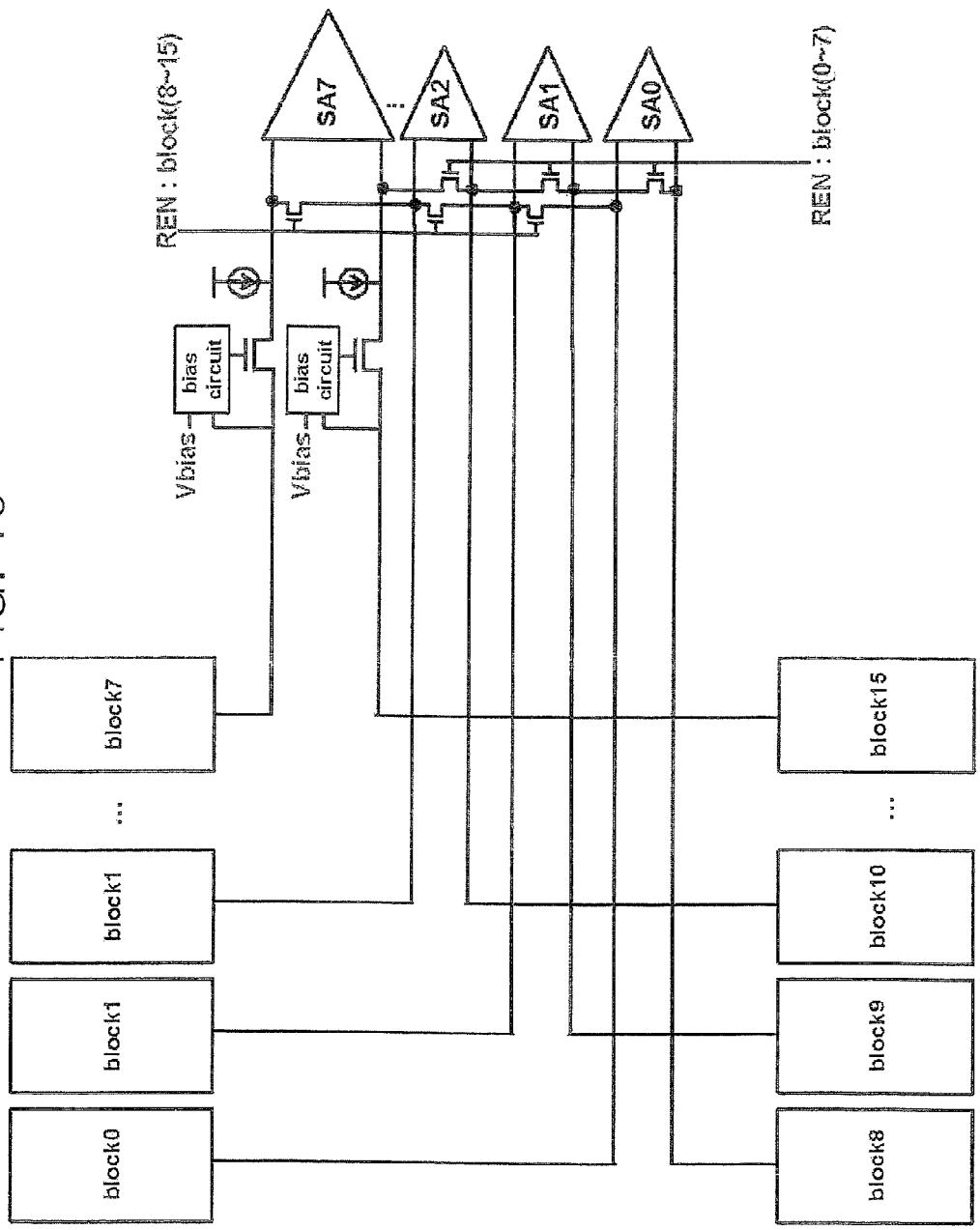
FIG. 16 is a simplified equivalent circuit of memory blocks 0-7 and memory blocks 8-15 coupled to inputs of sense amplifier circuits SA0-7 shown in FIG. 16.

FIG. 15 is a schematic illustration of memory blocks 0-7 and memory blocks 8-15 coupled to inputs of sense amplifier circuits SA0-7, wherein the sense amplifier circuits are selectively coupled to reference cells included in a plurality of memory blocks included in memory blocks other than those to which a read operation is directed. For example, in response to a read operation to data cells included in blocks 8-15, one of the inputs for each of the sense amplifier circuits SA0-7 is selectively coupled to reference cells included in blocks 0-7 whereas the remaining inputs of the sense amplifier circuits SA0-7 are selectively coupled to data cells included in memory blocks 8-15, which is also illustrated in a simplified equivalent circuit of FIG. 16.

Figure 17:
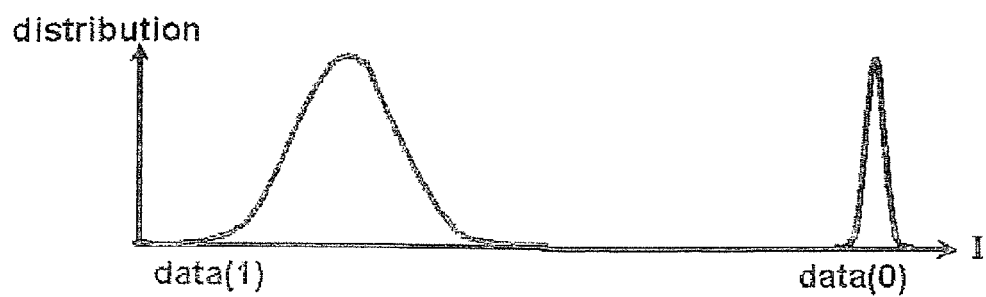
FIG. 17 is a schematic illustration of variations in the range of distribution of currents associated with logical data values stored in data cells/reference cells.

FIG. 17 is a schematic illustration of variations in the range of distribution of currents associated with logical data values stored in data cells/reference cells. In particular, FIG. 17 shows that the current associated with a program resistance of a resistive memory cell having a state corresponding to a logical data one can be a resistance that varies widely compared to variation in currents generated by cells programmed with logical data zero. Accordingly, the currents generated by cells being programmed with logical data zero can provide currents in a much narrower range than currents generated by memory cells programmed to store a logical data value of one.

Figure 18:
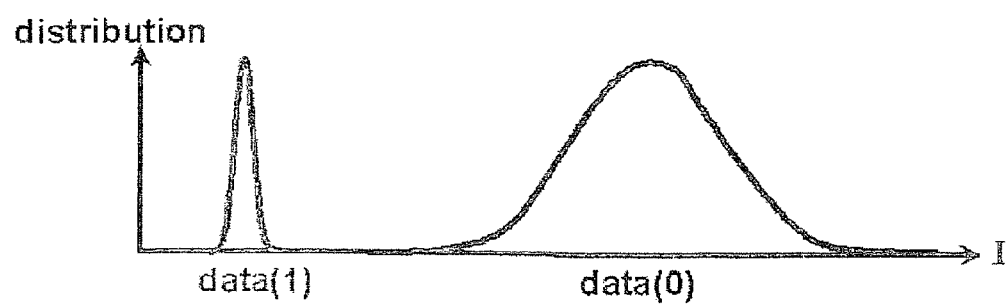
FIG. 18 is a schematic illustration that shows a relatively narrow distribution range for currents generated by data cells storing a logical data value of one and the current generated by memory cells storing logical data values of zero can occur over a relatively wide range.

FIG. 18 is a schematic illustration that shows a relatively narrow distribution range for currents generated by data cells storing a logical data value of one and the current generated by memory cells storing logical data values of zero can occur over a relatively wide range.

Figure 19:
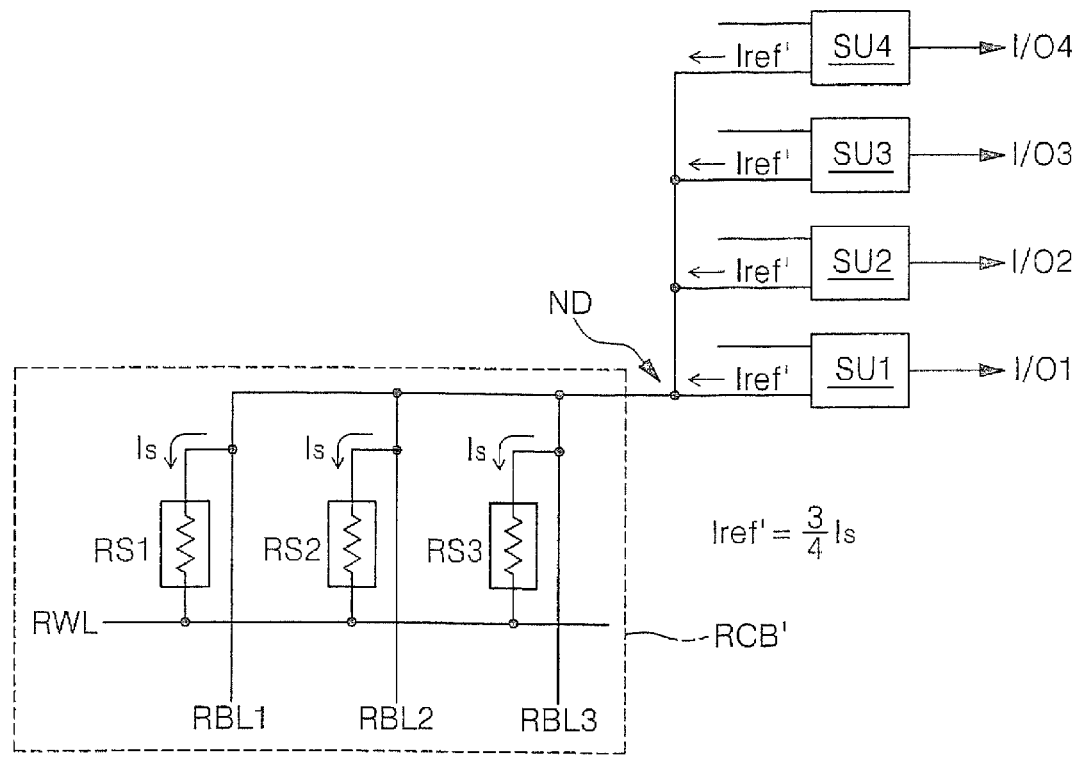
FIG. 19 is a schematic illustration of a reference current circuit RCB' including three reference cells RS1-RS3 coupled to four sense amplifier circuits SU1-4 each providing a reference current $I_{ref}^1$ to the reference current circuit RCB' according to some embodiments of the invention.

FIG. 19 is a schematic illustration of a reference current circuit RCB' including three reference cells RS1-RS3 coupled to four sense amplifier circuits SU1-4 each providing a reference current $I_{ref}{}'$ to the reference current circuit RCB'. It will be understood that all of the reference cells RS1-3 can be programmed to the same state. For example, each of the reference cells RS1-RS3 can be programmed to either a logical data value of one or a logical data value of zero. Accordingly, the current $I_{ref}{}'$ can be equal to about ¾ of the current provided to each of the reference cells RS1-RS3. Accordingly, the reference current may be provided in an amount that is according to an unequally weighted distribution of resistance values among the reference cells. In other words, as described above, the reference cells can be programmed to a single value as opposed to an equal number of different values (i.e., an equal number of cells programmed to logical data value zero and logical data value one).

Moreover, as shown above in reference to FIG. 19, the reference current used by the sense amplifiers to determine between the different data values stored in the data cells can be set according to only one of the logical data values so that an unusually wide distribution range associated with one of the logical data values can be compensated for. For example, as shown in FIG. 17, a relatively wide range of distribution for logical data value one may present problems if the reference current is generated as a midpoint between the two logical data values. In other words, if the reference current is generated as the midpoint between the logical data value one and logical data value zero, it is possible that the reference current may overlap with an upper range of the distribution of logical data value one thereby possibly generating errors when reading data cells. In contrast, as shown in FIG. 18, the reference current may be generated to be nearer to the logical data value one having the narrower range of distribution.

Figure 20:
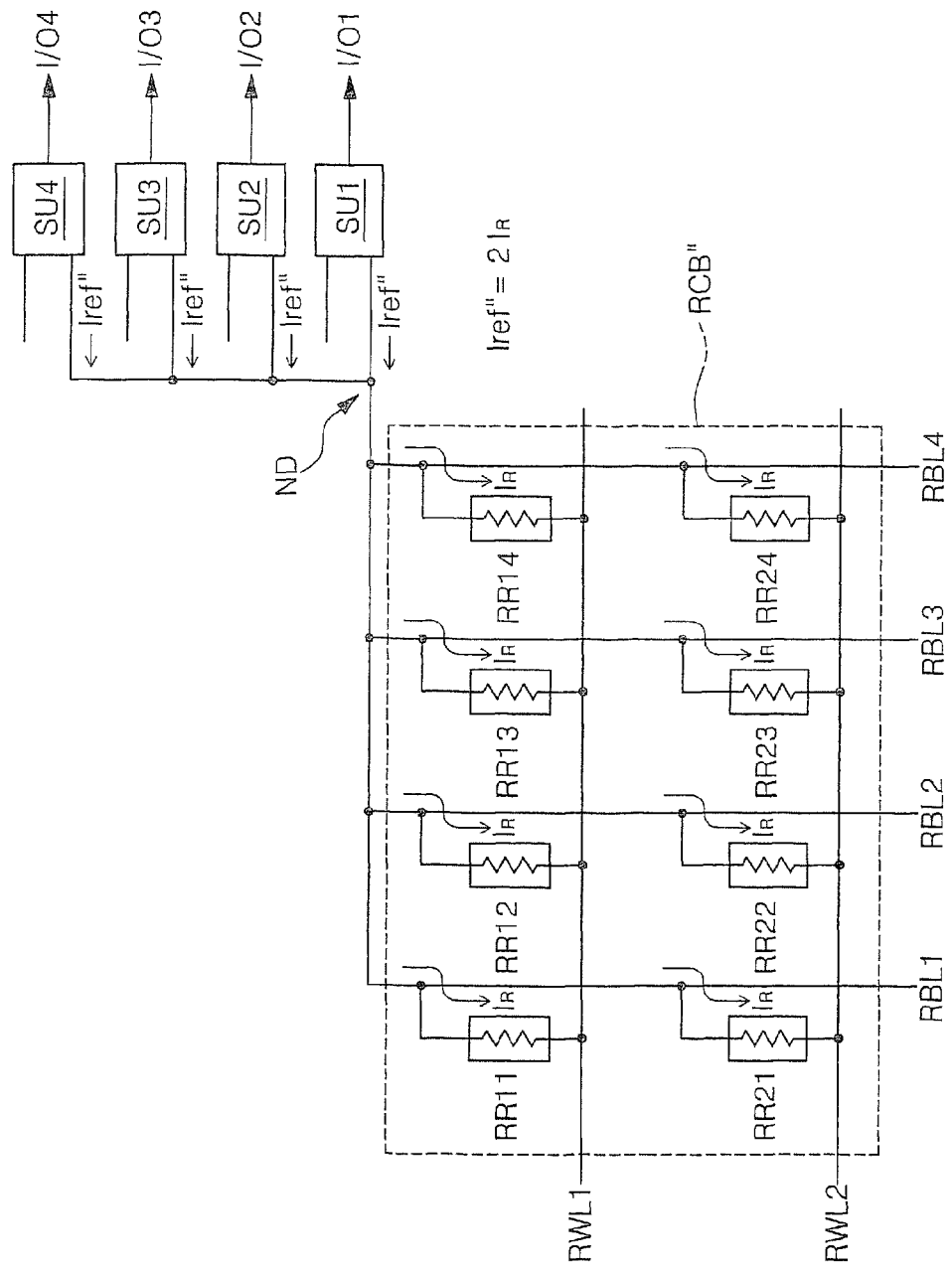
FIG. 20 is a schematic that illustrates reference cells coupled to sense amplifier circuits SU1-SU4 in some embodiments according to the invention.

FIG. 20 is a schematic that illustrates reference cells coupled to sense amplifier circuits SU1-SU4 in some embodiments according to the invention. In particular, the reference cells can be arranged as a parallel arrangement where each parallel leg includes at least two reference cells in serial. Furthermore, each of the serial elements in the parallel legs can be activated by a separate reference wordline RWL1 and RWL2. According to FIG. 20, the reference current provided by the sense amplifier circuits SU1-4 can thereby be generated to be about twice the current provided to each of the parallel legs of the reference current circuit RCB" to thereby reduce the possibility of mischaracterizing data read from the data cells in situations where the distribution of the logical data value zero/one is particularly wide as shown, for example, in FIG. 18.

As described herein, embodiments according to the invention can provide for at least three ReRAM reference cells coupled in parallel with one another and configured to provide a reference current to respective ReRAM sense amplifier circuits. For example, circuits according to some embodiments of the invention can provide a relatively large number of reference cells where half are programmed with a logical data value of zero and half are programmed with a logical data value of one so that the parallel combination can provide a reference current that approximates a midpoint between reference currents associated with the logical data values of zero. Furthermore, the reference current may be less subject to process variation as the greater number of reference cells may provide a more accurate representation of a true midpoint between the data values.

In some embodiments according to the invention, when a read operation is performed to a first block of memory, reference cells in a second block of memory are used to provide a reference current to the sense amplifier used to read the data from the first block of memory. In still other embodiments according to the invention, either of the inputs of the sense amplifier circuits can be used to provide the reference current. In particular, the inputs of the sense amplifier circuits may be coupled to reference block select transistors that are configured to couple together the inputs of the sense amplifier circuits that are to be provided with the reference current.

Furthermore, the input of the sense amplifier circuit that is to be coupled to the other inputs can be responsive to the block of memory to which the read operation is directed. Accordingly, a read to a first block of memory can result in data being provided to a first set of inputs of the sense amplifier circuits whereas the remaining inputs of the sense amplifier circuits are coupled to reference cells in a second block of memory.

In still other embodiments according to the invention, reference cells from different blocks can be coupled together in response to a read operation to a memory block that is outside those blocks that are coupled together. In other words, a read to a particular block of memory can result in reference cells from blocks other than that to which the read is directed being coupled together.

In still further embodiments according to the invention, a current reference circuit can include a number of reference cells that are configured to provide respective reference currents upon activation to a sense amplifier. The amounts of current provided by the reference cells can have an unequally weighted distribution of resistance values. In other words, in some embodiments according to the invention, the number of reference cells used to store logical data values of one may be unequal to the number of reference cells used to store a data value of zero. Accordingly, the reference circuit may be configured to compensate for a particular distribution of values provided by data cells that may be caused by particular process parameters.

In still other embodiments according to the invention, the current reference circuit may be configured so that all the reference cells store equal data values to provide substantially equal reference currents to the sense amplifier circuits coupled thereto.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A Resistance based Random Access Memory (ReRAM) comprising:
   a sense amplifier circuit including a first input coupled to a bit line of a reference cell in a first block of the ReRAM responsive to a read operation to a second block.

2. A ReRAM according to claim 1 further comprising:
   a second input of the sense amplifier circuit coupled to a reference cell in the second block responsive to a read operation to the first block.

3. A ReRAM according to claim 2 wherein the first and second blocks comprise arrays of data cells each coupled to a respective bit line and to a respective word line of the ReRAM.

4. A ReRAM according to claim 2 wherein the first and second blocks comprise arrays of data cells each coupled to respective bit lines and to respective access transistors, wherein the access transistors are coupled to respective data cells.

5. A ReRAM according to claim 4 wherein each of the data cells is configured for access responsive to activation of a respective access transistor using a respective word line and activation of a respective bit line couple to the respective access transistor.

6. A ReRAM according to claim 3 wherein each of the data cells is configured for access responsive to activation of a respective word line coupled to the respective access transistor and activation of a respective bit line coupled to the respective access transistor.

7. A ReRAM according to claim 2 wherein the sense amplifier circuit comprises a first sense amplifier circuit, the ReRAM further comprising:
   a second sense amplifier circuit including first and second inputs; and
   a reference block select transistor coupled between the first input of the first sense amplifier circuit and the first input of the second sense amplifier circuit, wherein the reference block select transistor is configured to coupled the first inputs of the first and second sense amplifier circuits to the reference cells responsive to a read operation to a block of the ReRAM other than a block including the reference cells.

8. A Resistance based Random Access Memory (ReRAM) comprising:
   a plurality of sense amplifier circuits configured to receive data from data cells from a plurality of different blocks in the ReRAM and to receive reference voltages from reference cells from the plurality of different blocks; and
   a plurality of reference block select transistors coupled to inputs to the plurality of the sense amplifier circuits and configured to couple the inputs to reference cells included in the plurality of different blocks responsive to a read operation to a block of the ReRAM other than the remaining ones.

* * * * *